United States Patent
Lin (10) Patent No.: US 7,280,064 B2
(45) Date of Patent: Oct. 9, 2007

(54) PIPELINE ADC WITH MINIMUM OVERHEAD DIGITAL ERROR CORRECTION

(75) Inventor: Chia-Liang Lin, Union City, CA (US)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/308,119

(22) Filed: Mar. 7, 2006

(65) Prior Publication Data

US 2007/0052573 A1 Mar. 8, 2007

Related U.S. Application Data

(60) Provisional application No. 60/596,201, filed on Sep. 8, 2005.

(51) Int. Cl.
*H03M 1/12* (2006.01)
(52) U.S. Cl. .................. 341/155; 341/120; 341/161
(58) Field of Classification Search ............ 341/120, 341/122, 155, 161, 172
See application file for complete search history.

(56) References Cited

U.S. PATENT DOCUMENTS

| | | | | |
|---|---|---|---|---|
| 5,499,027 | A * | 3/1996 | Karanicolas et al. | 341/120 |
| 6,563,445 | B1 * | 5/2003 | Sabouri | 341/120 |
| 6,606,042 | B2 * | 8/2003 | Sonkusale et al. | 341/120 |
| 6,611,222 | B1 * | 8/2003 | Murphy | 341/155 |
| 6,861,969 | B1 * | 3/2005 | Ali | 341/161 |
| 7,006,028 | B2 * | 2/2006 | Galton | 341/155 |
| 7,075,465 | B2 * | 7/2006 | Jonsson et al. | 341/120 |
| 7,119,729 | B2 * | 10/2006 | Wada et al. | 341/161 |
| 7,154,426 | B2 * | 12/2006 | Tani et al. | 341/155 |
| 2002/0011944 | A1 * | 1/2002 | Wu | 341/120 |
| 2005/0200512 | A1 * | 9/2005 | Tani et al. | 341/155 |

FOREIGN PATENT DOCUMENTS

EP 1 441 445 7/2004

OTHER PUBLICATIONS

Paul Yu et al. "A 14b 40Msample/s Pipelined ADC with DHCA.", Texas Instruments, Inc., Dallas TX., no date.
Sang-Min Yoo et al., "A 2.5-V 10-b 120-MSample/s CMOS Pipelined ADC Based on Merged-Capacitor Switching.", IEEE Transaction on Circuits and Systems II, May 2004, pp. 269-275, vol. 51, No. 5.
Jorge Guilherme et al. "A True Logarithmic Analog-to-Digital Pipeline Converter with 1.5 bit/stage and Digital Correction", 2001 IEEE, pp. 393-396, http://ieeexplore.ieee.org/iel5/7591/20704/00957762.pdf.

* cited by examiner

*Primary Examiner*—Linh Nguyen
(74) *Attorney, Agent, or Firm*—Winston Hsu (57) ABSTRACT

The most hardware efficient way to implement an N-stage pipeline ADC is to use (G+1)-level ADC-DAC for its first (N−1) stages and use (2·G−1)-level ADC for the last stage, where G is the inter-stage gain. For the fist (N−1) stages using (G+1)-level ADC-DAC, the (G+1) levels are uniformly distributed between −(G−1)/G and (G−1)/G; inclusively. The spacing between two adjacent levels is $2(G-1)/G^2$. For the last stage using (2·G−1)-level ADC, the (2·G−1)-levels are uniformly distributed between −(G−1)/G and (G−1)/G, inclusively. The spacing between two adjacent levels is 1/G.

18 Claims, 8 Drawing Sheets

FIG. 1

PRIOR ART

FIG. 2

PRIOR ART

FIG. 3

PRIOR ART

FIG. 4

PRIOR ART

PRIOR ART

FIG. 8

PRIOR ART

PIPELINE ADC WITH MINIMUM OVERHEAD DIGITAL ERROR CORRECTION

CROSS-REFERENCE TO RELATED PATENT APPLICATION

This patent application claims the Priority benefits of U.S. provisional application titled "PIPELINE ADC WITH MINIMUM OVERHEAD DIGITAL ERROR CORRECTION" filed on Sep. 8, 2005, Ser. No. 60/596,201, the entire disclosure of which is incorporated herein by reference.

BACKGROUND OF THE INVENTION

1. Field of the Invention

The present invention relates to pipeline ADC (analog-digital converter), in particular to pipeline ADC that uses minimum overhead in digitally correcting the errors in its internal comparators.

2. Description of Related Art

Figure 1:
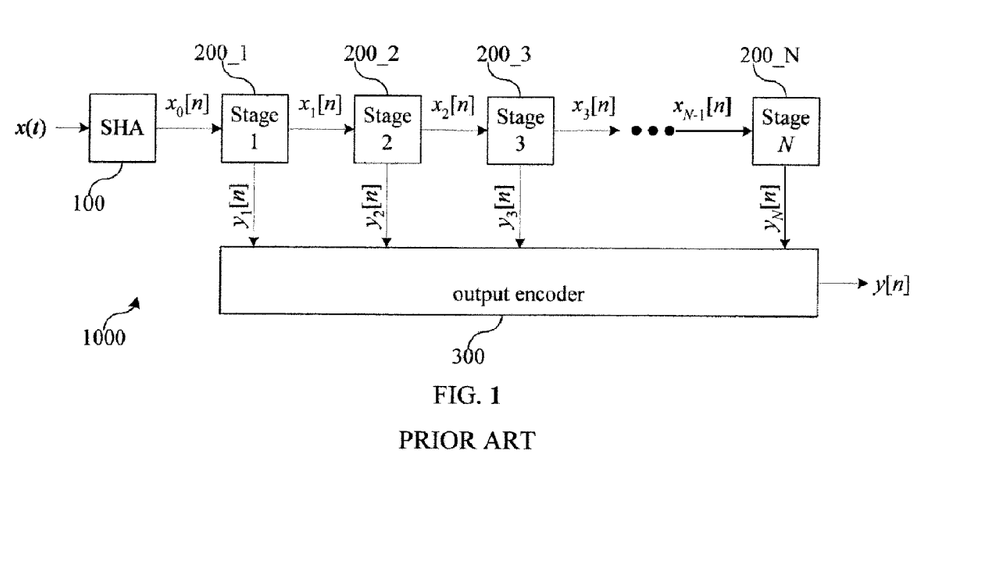
FIG. 1 depicts a block diagram of a prior art pipeline analog-to-digital converter.

Pipeline ADCs are well known in prior. FIG. 1 depicts a typical N-stage pipeline ADC 1000 comprising a sample-and-hold amplifier SHA 100, N pipeline stages 200_1, 200_2, 200_3, and so on, and an output encoder 300. SHA 100 converts the continuous-time input voltage x(t) into discrete-time analog sample $x_0[n]$, which is the value of the input voltage x(t) at the time instant of nT, where T is the period of the sampling clock and n is a time index. The first stage 200_1 receives the analog sample $x_0[n]$ and generates two outputs: a digital output $y_1[n]$ that is a coarse digital representation of $x_0[n-1]$ (which is the analog sample of previous time step), and an analog output $x_1[n]$ that represents the residual error of the coarse quantization. The residual error is passed to its next stage ($2^{nd}$ stage 200_2) for further processing. In this manner, each pipeline stage, said stage k, receives an analog sample from its preceding stage, said stage (k−1), (except for the first stage, which does not have a preceding stage but receives the analog sample from SHA 100), generates a digital output which represents a coarse quantization of its input of the previous time step, and passes an analog output, which represented the residual error of the quantization, to its subsequent stage, said stage (k+1). For the last stage ($N^{th}$ stage 200_N), there is no subsequent stage and therefore it does not need to generate the residual error. The digital outputs of all these pipeline stages are passed to an output encoder 300, which encodes them into a single output sequence y[n], which is the end result of the analog-to-digital conversion for the analog input voltage x(t).

Figure 2:
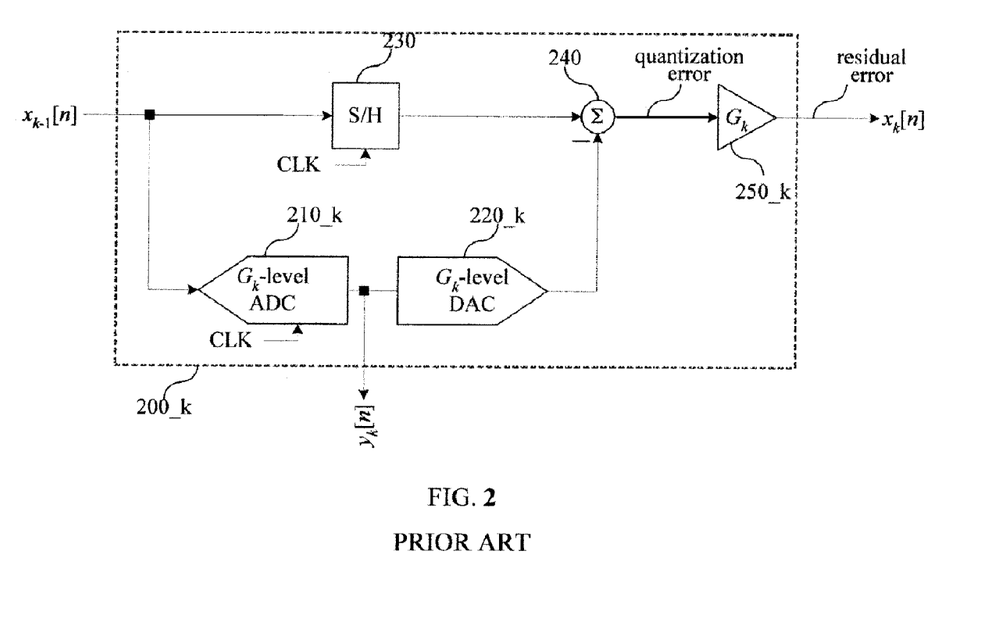
FIG. 2 depicts a block diagram of a pipeline stage within a prior art pipeline analog-to-digital converter.

FIG. 2 depicts a typical pipeline stage 200_k (k=1, 2, and so on). In accordance with the clock CLK, the analog input sample $x_{k-1}[n]$ is sampled and held by S/H 230. Also, the analog input sample $x_{k-1}[n]$ is converted into a digital output $y_k[n+1]$ by a $G_k$-level ADC (analog-digital converter) 210_k. (The time index n is increased by 1 to reflect one-clock latency between input and output.) Let the full-scale range of the input voltage be from −VREF to VREF. Without loss of generality, we may normalize the ADC levels so that a digital output "1" would correspond to the full-scale voltage VREF. At the clock edge when S/H 230 latches the input, ADC 210_k determines which one of its $G_k$ levels is closest to the input. The ADC level that is closest to the input $x_{k-1}[n]$, denoted as $y_k[n+1]$, is the digital output of this stage of the next time index. The digital output is passed to a $G_k$-level DAC (digital-analog-converter) 220_k, which converts the digital output into analog voltage, resulting in a coarse representation of the analog input $x_{k-1}[n]$. The coarse representation from DAC 220_k is subtracted from the analog input sample $x_{k-1}[n]$ via a summer 240. The output of summer 240 represents the quantization error due to the analog to digital conversion. The $G_k$ levels of ADC 210_k (and also of DAC 220_k) are uniformly distributed between $-VREF \cdot (G_k-1)/G_k$ to $VREF \cdot (G_k-1)/G_k$, inclusively, therefore the spacing between two adjacent levels is always $2 \cdot VREF/G_k$. As a result, the quantization error is always between $-VREF/G_k$ and $VREF/G_k$. A gain block 250_k is used to amplify the quantization error by a factor of $G_k$ to boost it into the full-scale range of from −VREF to VREF. The resultant voltage, referred to as the "residual error" of this stage, is passed to the next stage for further processing. The gain block 250_k provides the so-called "inter-stage gain" so that full-scale range of each stage remains the same. For the last stage ($N^{th}$ stage 200_N), there is an ADC 210_N for generating a digital output; there is no need to have S/H 230, DAC 220_N, summer 240, and gain block 250_N because there is no subsequent stage.

Figure 3:
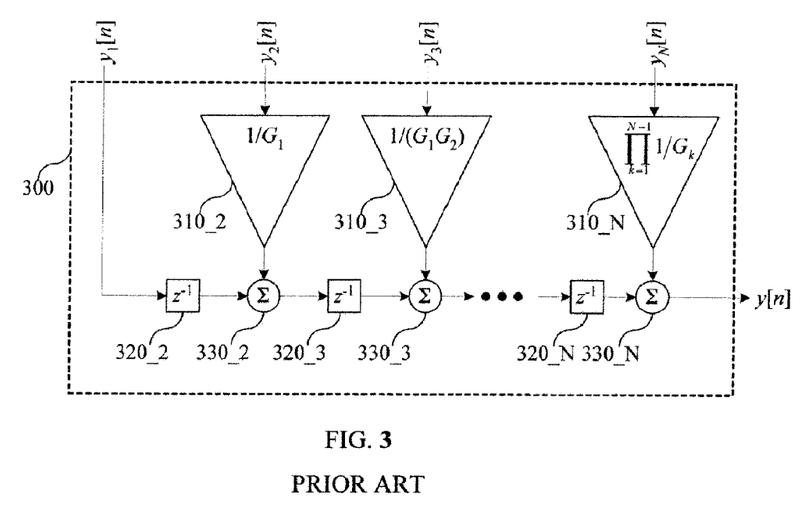
FIG. 3 depicts a block diagram of an output encoder within a prior art pipeline analog-to-digital converter.

FIG. 3 depicts a typical output encoder 300. It receives digital outputs from all N pipeline stages, i.e. $y_k[n]$ for k=1 to N. The end result y[n] is obtained by summing up the digital outputs from all N pipeline stages. However, to account for the inherent pipeline delays associated with the pipeline stages, a series of unit-cycle delays 320_2, 320_3, and so on are needed when summing up the digital outputs from all N stages. Also, to account for the "inter-stage gain" we uses, a series of gain blocks 310_2, 310_3, and so on are needed to adjust the digital outputs from stages 2, 3, and so on. For stage 2, the output needs to be scaled by a factor of $1/G_1$ to offset the inter-stage gain provided by stage 1. For stage 3, the output needs to be scaled by a factor of $1/(G_1 G_2)$ to offset the inter-stage gains provided by stage 1 and stage 2. For stage k, the output needs to be scaled by a factor of $1/(G_1 G_2 \ldots G_{k-1})$ to offset the inter-stage gains provided by all its (k−1) preceding stages. Mathematically, the encoder output can be written as:

$$y[n]=y_1[n-(N-1)]+1/G_1 \cdot y_2[n-(N-2)]+1/(G_1 G_2)\cdot y_3[n-(N-3)]+ \ldots +1/(G_1 G_2 \ldots G_{N-2})\cdot y_{N-1}[n-1]+1/(G_1 G_2 \ldots G_{N-1})\cdot y_N[n]$$

Aforementioned prior art pipeline ADC is vulnerable to the error from $G_k$-level ADC 210_k of FIG. 2 due to the offsets in its internal comparators. To illustrate this problem, we may look at 2-level (1-bit) ADC for example. A 1-bit ADC has two levels: ½ and −½ (again, we normalize the full-voltage VREF to 1). It uses a comparator to compare the input with zero. If the input is greater than or equal to zero, the ADC determines that the level "½" best represents the input. Else, it determines that the level "−½" best represents the input.

Mathematically, the behavior of a 1-bit pipeline stage 200_k can be described as follows:

$$y_k[n+1] = \begin{cases} 1/2 & x_{k-1}[n] \geq 0 \\ -1/2 & x_{k-1} < 0 \end{cases}$$

$$x_k[n+1] = 2 \cdot (x_{k-1}[n] - VREF \cdot y_k[n+1])$$

Figure 4:
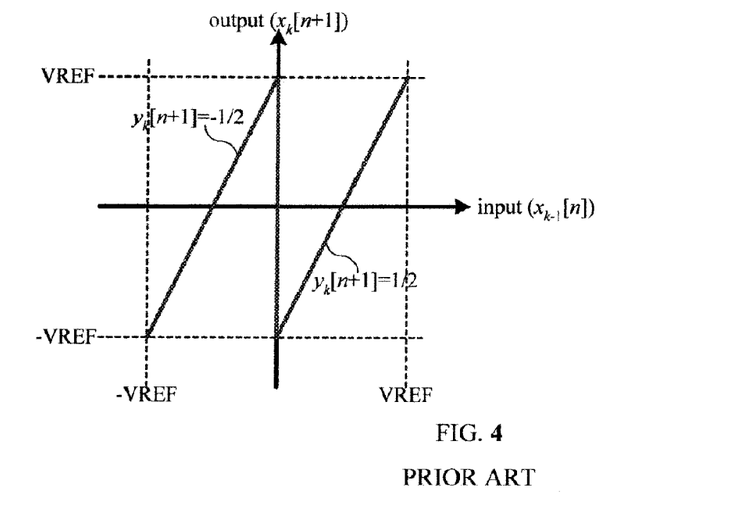
FIG. 4 depicts an ideal input-output transfer relation of a prior art 1-bit pipeline stage.
Figure 5:
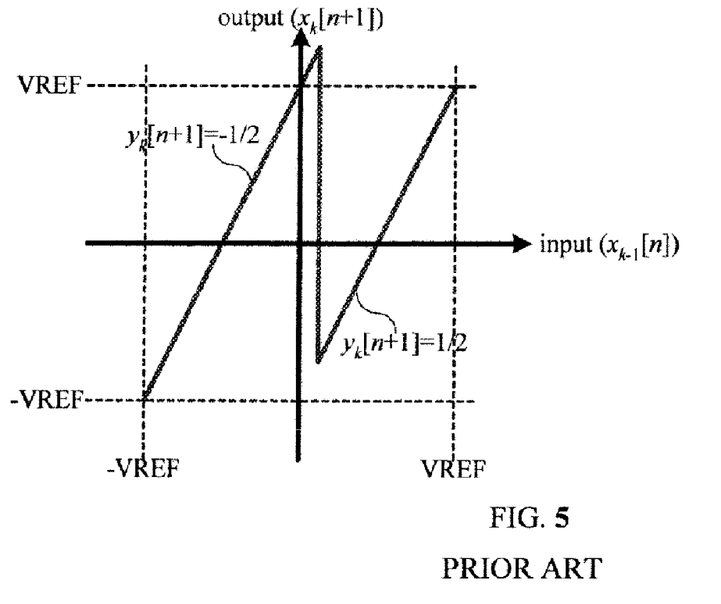
FIG. 5 depicts a practical input-output transfer relation of a prior art 1-bit pipeline stage.

FIG. 4 depicts the ideal input-output transfer characteristics of pipeline stage 200_k of FIG. 2 using 2-level ADC-DAC with inter-stage gain of two (i.e. $G_k$=2). When the input $x_{k-1}[n]$ is positive or zero, the digital output is ½ and the analog output is $2 \cdot x_{k-1}[n]-VREF$; when the input $x_{k-1}[n]$ is negative, the digital output is −½ and the analog output is 2·$x_{k-1}[n]$+VREF. However, the comparator within a practical ADC 210_k in the pipeline stage 200_k of FIG. 2 may likely have an offset so that it may make a wrong detection. For example, if there is an offset of VREF/8 in the comparator, the digital output will be ½ only when the input is greater than or equal to VREF/8. The input-output transfer characteristics for this particular instance is depicted in FIG. 5. For an input between 0 and VREF/8, the output will exceed the full scale of its next stage, resulting in significant error. Therefore, the comparator needs to be very accurate. Usually, the offset of the comparator needs to be smaller than the LSB (least significant bit) of the overall ADC. This requirement is usually very hard to fulfill.

To resolve this problem, prior art pipeline ADC usually employs a 3-level (1.5-bit) pipeline stage. A 1.5-bit stage is different from a 1-bit stage in using an additional level that best represents a small input. For example, besides the two decisions, "½" and "−½," a 1.5-bit stage adds a $3^{rd}$ level "0" when the input is between −VREF/4 and VREF/4. Mathematically, we have $$y_k[n+1] = \begin{cases} 1/2 & x_{k-1}[n] \geq VREF/4 \\ 0 & x_{k-1}[n] \leq x_{k-1}[n] < VREF/4 \\ -1/2 & x_{k-1}[n] < -VREF/4 \end{cases}$$

$$x_k[n+1] = 2 \cdot (x_{k-1}[n] - VREF \cdot y_k[n+1])$$

Figure 6:
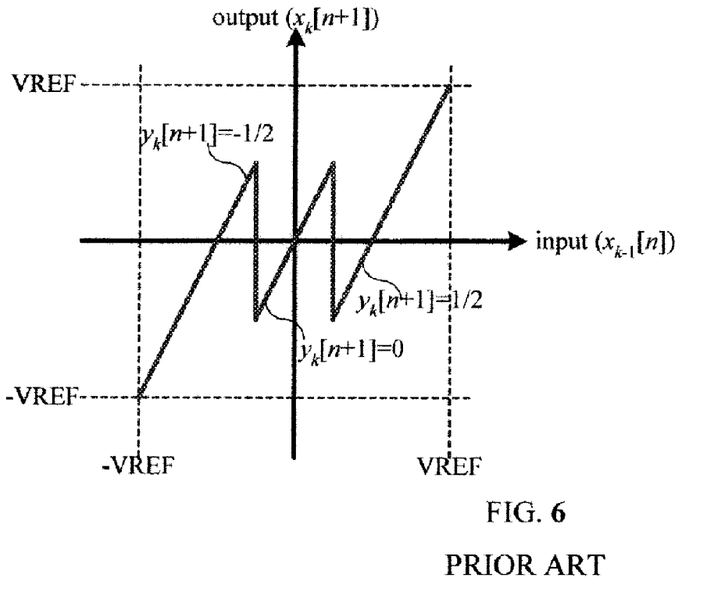
FIG. 6 depicts an ideal input-output transfer relation of a prior art 1.5-bit pipeline stage.
Figure 7:
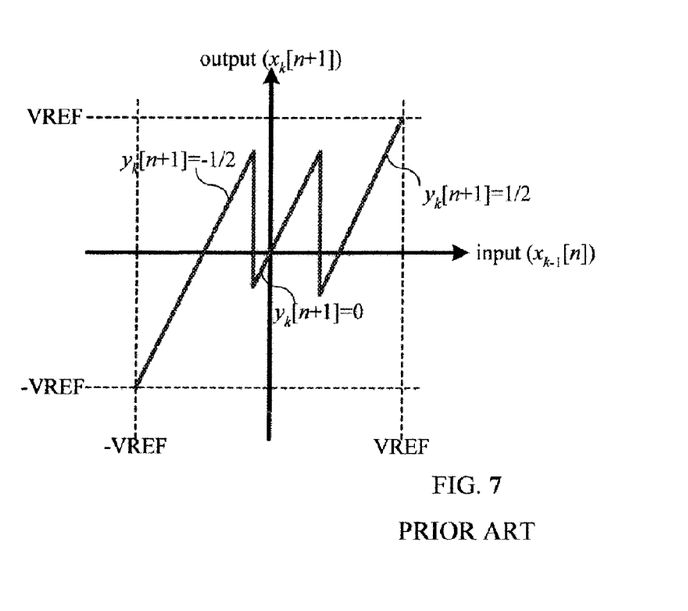
FIG. 7 depicts a practical input-output transfer relation of a prior art 1.5-bit pipeline stage.

The ideal transfer function of a 1.5-bit pipeline stage is depicted in FIG. 6. Unlike 1-bit pipeline stage, 1.5-bit pipeline stage can tolerate a large offset in its internal comparators. The input-output transfer characteristics of a 1.5-bit pipeline stage with a comparator offset of VREF/8 is depicted in FIG. 7. Due to the extra "0" decision, the output will not exceed the full scale of its next stage even when the ADC makes a wrong decision. Although ADC makes wrong decisions due to comparator offset, the error due to the wrong decision is absorbed as part of the residual error of this pipeline stage. When the next stage takes the residual error for further processing, the error due to wrong decision in the preceding stage will be corrected because the error has been absorbed as part of its input. For example, consider the first two stages. Let the analog input be 5/16·VREF. If there is no comparator offset, the $1^{st}$ stage generates a digital output ½ and a residual error −⅜·VREF. The $2^{nd}$ stage takes the residual error from the $1^{st}$ stage and generates a digital output −½ and a residual error ¼·VREF. The output encoder will then have the following representation for the input 5/16·VREF:

(½)+$2^{-1}$·(−½)=½−¼=¼

On the other hand, if the $1^{st}$ stage has a comparator offset of VREF/8 while the $2^{nd}$ stage does not, the $1^{st}$ stage generates a wrong digital output 0 and a residual error ⅝·VREF. The $2^{nd}$ stage takes the residual error from the $1^{st}$ stage and generates a digital output ½ and a residual error ¼·VREF. The output encoder will then have the following representation for the input 5/16·VREF:

0+$2^{-1}$·(½)=0+¼=¼

It is clear that the error in the $1^{st}$ stage (a wrong decision of "0) is corrected by the $2^{nd}$ stage (an extra residual voltage of ⅝·VREF−(−⅜·VREF)=VREF). This is because the error due to the wrong decision from the $1^{st}$ stage has been absorbed as part of the residual error and passed to the $2^{nd}$ stage. Likewise if there is comparator error in the $2^{nd}$ stage, it can be corrected by the $3^{rd}$ stage. In this manner, the comparator error of any stage of interest can be corrected by its subsequent stage. This technique is commonly referred to as "digital error correction" for comparator error.

A 1.5-bit pipeline architecture greatly relaxes the requirement on the accuracy of the internal ADC of a pipeline stage, and therefore is a very popular architecture. Note that the maximum comparator offset that a 1.5-bit stage can tolerate is VREF/4. If the comparator offset is over VREF/4, the residual error can still exceed the full-scale range (from −VREF to VREF) and thus go beyond what can be corrected by the next stage. However, the overhead in allowing such a relaxation is quite high. A 1-bit pipeline stage only needs one comparator, while a 1.5-bit pipeline stage needs two comparators: one compares the input with VREF/4, the other with −VREF/4. The overhead in the number of comparators is 100%. Also, a 1-bit pipeline stage only needs a two-level DAC, while a 1.5-bits pipeline stage needs a three-level DAC. The overhead in DAC levels is 50%. As will become obvious later in this disclosure, this is nonetheless the best one can do for a pipeline stage with inter-stage gain of 2 (i.e. $G_k$=2). However, for inter-stage that is higher than 2, one can certainly do better than that.

Figure 8:
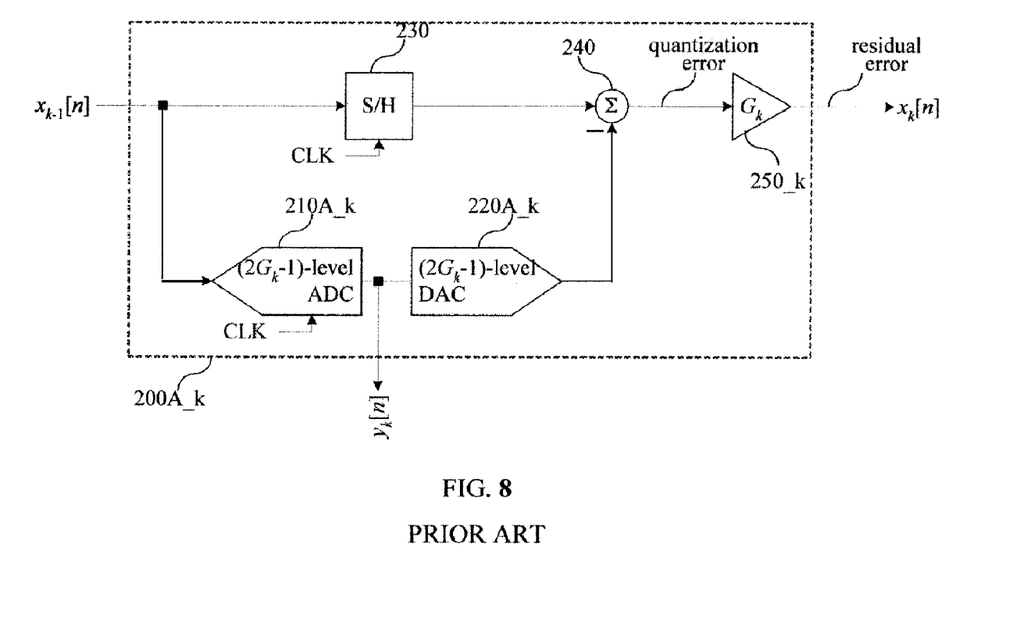
FIG. 8 depicts a prior art pipeline stage with digital error correction.

Although in theory the inter-stage gain $G_k$ can be any integer that is greater than 1, in practice people use exclusively powers of two (i.e. 2, 4, 8, 16, and so on) for easier signal processing in the output encoder. The top-level architecture of the prior art N-stage pipeline ADC with digital error correction is the same as that without digital error correction as depicted in FIG. 1 except for the following. Without digital error correction, the pipeline stages 200_1, 200_2, and so on, of FIG. 1 are implemented using the architecture 200_k depicted in FIG. 2; with digital error correction, these pipeline stages need to be replaced by pipeline stages 200A_1, 200A_2, and so on, respectively, which are implemented using the architecture 200A_k as depicted in FIG. 8. The architecture 200A_k depicted in FIG. 8 uses (2·$G_k$−1)-level ADC 210A_k and DAC 220A_k, while the architecture 200_k depicted in FIG. 2 uses $G_k$-level ADC 210_k and DAC 220_k. Digital error correction is implemented by simply changing $G_k$-level ADC-DAC to (2·$G_k$−1)-level ADC-DAC.

In prior art digital error correction scheme, the (2·$G_k$−1) levels (normalized with the full scale voltage VREF) for ADC-DAC are:

−($G_k$−1)/$G_k$, −($G_k$−2)/$G_k$, −($G_k$−3)/$G_k$, . . . , −2/$G_k$, −1/$G_k$, 0, 1/$G_k$, 1/$G_k$, . . . , ($G_k$−3)/$G_k$, ($G_k$−2)/$G_k$, ($G_k$−1)/$G_k$

For example, for inter-stage gain of 4, Paul C. Yu used 7-level stages with inter-stage gain of 4 in his article "A 14b 40 Msamples/s Pipelined ADC with DFCA" and the 7 levels are:

−¾, −½, −¼, 0, ¼, ½, ¾

Therefore, the overhead in ADC-DAC levels are (7−4)/4=75%.

For inter-stage gain of 8, Sang-Min Yoo et al. used 15-level stages with inter-stage gain of 8 in his article "A 2.5-V 10-b 120-MSamples/s CMOS Pipelined ADC Based on Merged-Capacitor Switching" and the 15 levels are:

−⅞, −¾, −⅝, −½, −⅜, −¼, −⅛, 0, ⅛, ¼, ⅜, ½, ⅝, ¾, ⅞

Therefore, the overhead in ADC-DAC levels are (15−8)/8=87.5%.

As will be shown later in this disclosure, one can certainly have much lower overhead in implementing digital error correction for these two cases.

What is needed is pipeline ADC that employs a digital error correction with minimum overhead in extra hardware.

BRIEF SUMMARY OF THIS INVENTION

In an embodiment, a pipeline analog-to-digital converter is disclosed, the converter comprising: a sequence of pipeline stages, each such stage, said stage k receiving an analog input, performing an analog-to-digital conversion on the analog input to generate a digital output, generating a residual analog signal, and passing the residual analog signal to its subsequence stage in said sequence, said stage (k+1) as the analog input for the subsequent stage, wherein, in at least one of said stages, the generation of the residual analog signal comprises using an amplifier with a gain G, where G is an integer greater than 2, and the digital output is a (G+1) level digital data.

In an embodiment, a method of performing analog-to-digital conversion is disclosed, the method comprising: performing analog-to-digital conversion using a sequence of pipeline stages, each such stage, said stage k receiving an analog input, performing an analog-to-digital conversion on the analog input to generate a digital output, generating a residual analog signal, and passing the residual analog signal to its subsequence stage in said sequence, said stage (k+1) as the analog input for the subsequent stage, wherein, in at least one of said stages, the generation of the residual analog signal comprises using an amplifier with a gain G, where G is an integer greater than 2, and the digital output is a (G+1) level digital data.

BRIEF DESCRIPTION OF THE DRAWINGS

The subject matter regarded as the invention is particularly pointed out and distinctly claimed in the concluding portion of the specification. The invention, both as to device and method of operation, together with features and advantages thereof may best be understood by reference to the following detailed description with the accompanying drawings in which:

DETAILED DESCRIPTION OF THIS INVENTION

The present invention relates to a pipeline ADC that employs digital error correction with minimum overhead. While the specifications described several example embodiments of the invention considered best modes of practicing the invention, it should be understood that the invention can be implemented in many ways and is not limited to the particular examples described below or to the particular manner in which any features of such examples are implemented.

In accordance with the present invention, to implement digital error correction for a pipeline stage with inter-stage gain of $G_k$, the most efficient architecture is to use $(G_k+1)$-level ADC-DAC. This is a significant improvement over prior art that uses $(2 \cdot G_k-1)$-level ADC-DAC, especially when the inter-stage gain is large.

Figure 9:
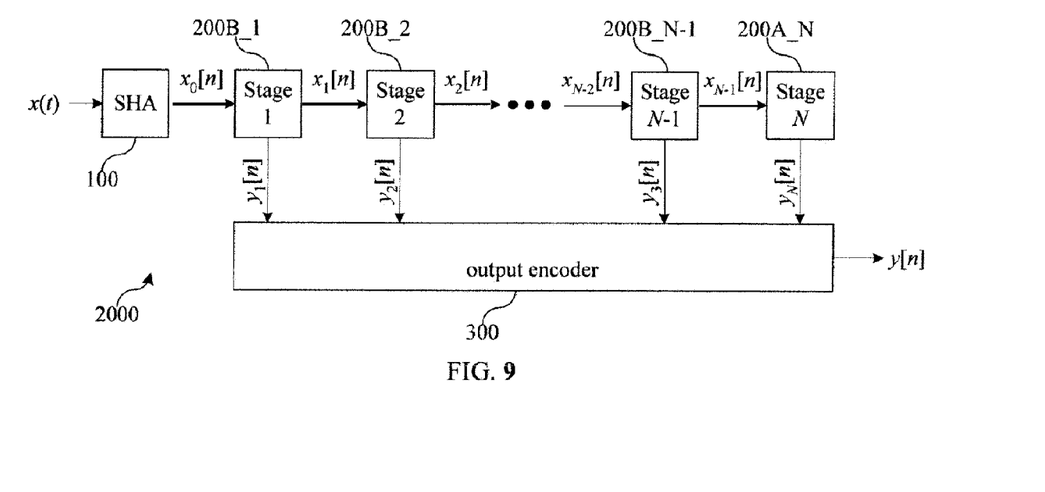
FIG. 9 depicts an N-stage pipeline ADC in accordance with the present invention.

The top-level architecture of the N-stage pipeline ADC in accordance with an embodiment of the present invention is depicted in FIG. 9, which is the same as that depicted in FIG. 1 except that (1) the first (N−1) pipeline stages 200_1, 200_2, and so on, are replaced by pipeline stages 200B_1, 200B_2, and so on, respectively, and that (2) the last pipeline stage ($N^{th}$ stage) 200_N is replaced by a pipeline stage 200A_N. In an embodiment of the present invention, at least one of the first (N−1) pipeline stages 200B_1, 200B_2, and so on, needs to use the minimum overhead architecture. This invention does not exclude using the prior art higher overhead architecture for some of the first (N−1) pipeline stages, but it is very obvious that it is most advantageous to use the minimum overhead architecture for all of the first (N1) stages. The last stage 200A_N comprises a $(2 \cdot G_N-1)$-level ADC. In a preferred embodiment, $G_N$ is the same as $G_{N-1}$, the inter-stage gain of stage (N−1). In an alternative embodiment, $G_N$ is a power of two higher than $G_{N-1}$.

Figure 10:
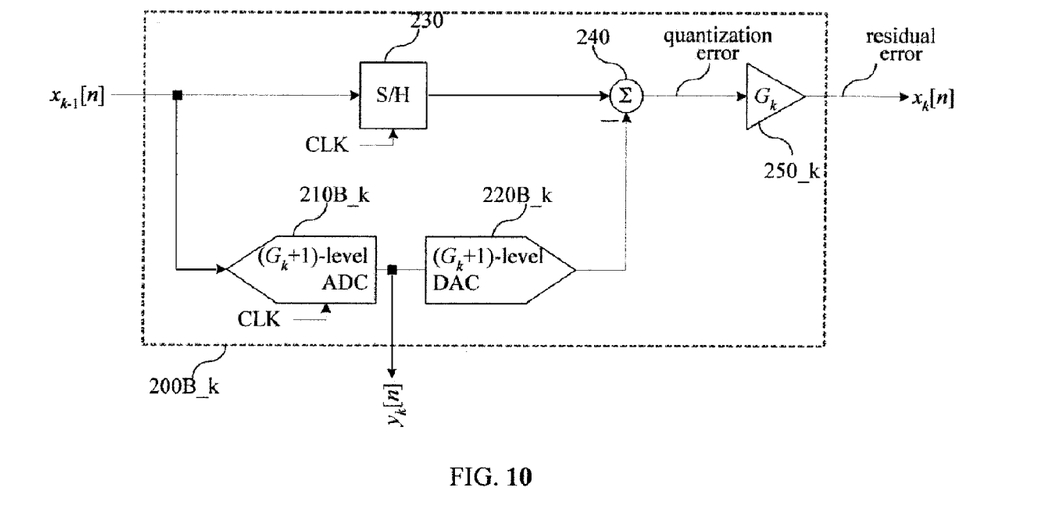
FIG. 10 depicts a minimum overhead pipeline stage in accordance with the present invention.

A typical embodiment of pipeline stage 200B_k (for k=1 to N−1) with minimum overhead is depicted in FIG. 10. It is the same as prior art architecture without digital error correction as shown in FIG. 2 except for that it uses $(G_k+1)$-level ADC 210B and DAC 220B, as opposed to $G_k$-level ADC 210 and DAC 220 in the case without digital error correction. Without loss of generality one may normalize the ADC-DAC levels with the full-scale voltage VREF. The $(G_k+1)$ levels are then uniformly distributed between $-(G_k-1)/G_k$ and $(G_k-1)/G_k$, inclusively. The spacing between two adjacent levels is always $2(G_k-1)/G_k^2$. To be specific, the $(G_k+1)$ levels are listed as follows:

$$\pm(G_k-1)/G_k, \pm(G_k-1)(G_k-2)/G_k^2, \pm(G_k-1)(G_k-4)/G_k^2, \ldots, \pm(G_k-1)(G_k-2P_k)/G_k^2$$

where $P_k = \mathrm{floor}(G_k/2)$.

Figure 11:
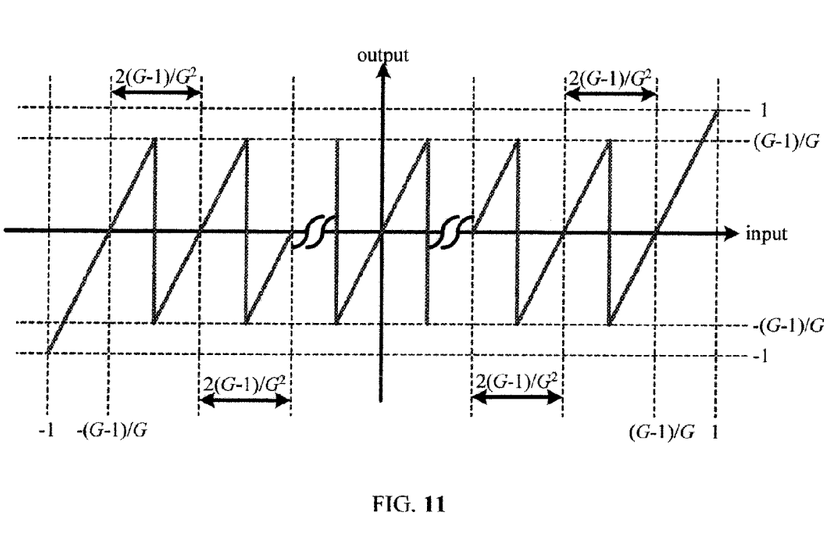
FIG. 11 depicts an ideal input-output transfer relation of the minimum overhead pipeline stage in accordance with the present invention.

The ideal input-output transfer characteristics of the minimum overhead pipeline stage 200A of inter-stage gain G is depicted in FIG. 11.

Similar to the 1.5-bit architecture, the ADC error of pipeline stage 200B_k due to comparator offset will be absorbed as part of the residual error and thus can be corrected by the subsequent stage. The maximum comparator offset that the minimum overhead pipeline stage 200B_k of inter-stage gain $G_k$ can tolerate is $VREF/G_k^2$. If the comparator offset is over $VREF/G_k^2$, the residual error can exceed the full-scale range (from −VREF to VREF) and thus go beyond what can be corrected by the next stage.

The present invention allows significant reduction in hardware cost. As opposed to the prior art that uses 7 levels, for instance, we only need the following 5 levels for ADC-DAC when the inter-stage gain is 4:

−¾, −⅜, 0, ⅜, ¾

As opposed to the prior art that uses 15 levels, for another instance, we only need the following 9 levels for ADC-DAC when the inter-stage gain is 8:

−⅞, −21/32, −7/16, −7/32, 0, 7/32, 7/16, 21/32, ⅞

However, note that the minimum overhead architecture can be applied only to the first (N−1) stages. For the last stage ($N^{th}$ stage), we still need to use the prior art approach that uses ($2 \cdot G_N - 1$)-level ADC. From the output encoder 300 depicted in FIG. 3, it is clear that the LSB (least significant bit) of the overall ADC, i.e. the granularity it can resolve, is determined by the quantization step of the last stage divided by the cascaded inter-stage gains from all its preceding stages. Mathematically, the LSB of the overall pipeline ADC is:

$$LSB = \Delta/(G_1 G_2 G_3 \ldots G_{N-1})$$

where Δ is the quantization step of the last stage. In order for the present invention to achieve the same overall LSB, one has to use the same quantization step for the last stage. Therefore, we have to use ($2 \cdot H_N - 1$)-level ADC for the last stage. The quantization step is then $1/G_N$. The LSB is then $$LSB = 1/(G_1 G_2 G_3 \ldots G_{N-1} G_N)$$

for both this present invention and the prior art.

In this manner, this present invention achieves the same overall resolution yet uses much less ADC-DAC levels for the first (N−1) stages.

To illustrate this point, we may use 4-stage pipeline with G=4 for all stages as an example. The LSB is $1/4^4 = 1/256$. When the input is, say $101/256 \cdot VREF$, what we get from the prior art scheme is $$1;2 + 4^{-1} \cdot (-\tfrac{1}{2}) + 4^{-2} \cdot (\tfrac{1}{4}) + 4^{-3} \cdot (\tfrac{1}{4}) = 101/256$$

What we get from the present invention is:

$$\tfrac{3}{8} + 4^{-1} \cdot (0) + 4^{-2} \cdot (\tfrac{3}{8}) + 4^{-3} \cdot (-\tfrac{1}{4}) = 101/256$$

For another example, if the input is $163/256 \cdot VREF$, what we get from the prior art scheme is $$\tfrac{3}{4} + 4^{-1} \cdot (-\tfrac{1}{2}) + 4^{-2} \cdot (\tfrac{1}{4}) + 4^{-3} \cdot (-\tfrac{1}{4}) = 163/256$$

What we get from the present invention is:

$$\tfrac{3}{4} + 4^{-1} \cdot (-\tfrac{3}{8}) + 4^{-2} \cdot (-\tfrac{3}{8}) + 4^{-3} \cdot (\tfrac{1}{4}) = 163/256$$

Therefore, we achieve exactly the same resolution of data conversion at a much lower hardware cost.

For a pipeline ADC employing an inter-stage gain of G without digital error correction, we need G-level DAC and (G−1) comparators. The minimum overhead in number of comparators is 1/(G−1), while the minimum overhead in DAC levels are 1/G. The minimum overhead is achieved with the manner in accordance with the present invention. Table 1 tabulates the comparison of overhead for digital error correction among various architectures. It shows the present invention greatly reduces the hardware overhead.

However, the maximum comparator offset that the minimum overhead architecture can tolerate is also reduced. Nevertheless, even though the maximum tolerable offset is reduced to VREF/64 for the case of inter-stage gain of 8, the requirement is not very hard to fulfill. For a typical full-scale voltage of VREF=1V, we need the comparator offset to be smaller than 1/64V, which is usually quite easy to achieve.

TABLE 1

Comparison of overhead for digital error correction among various architectures

| Architecture | ADC-DAC levels (normalized with VREF) | Overhead in # comparators | Overhead in # DAC levels | Maximum comparator offset allowed |
|---|---|---|---|---|
| 3-level, 2x gain (prior art) | −1/2, 0, 1/2 | 100% | 50% | VREF/4 |
| 7-level, 4x gain (prior art) | −3/4, −1/2, −1/4, 0, 1/4, 1/2, 3/4 | 100% | 75% | VREF/8 |
| 15-level, 8x gain (prior art) | −7/8, −3/4, −5/8, −1/2, −3/8, −1/4, −1/8, 0, 1/8, 1/4, 3/8, 1/2, 5/8, 3/4, 7/8 | 100% | 87.5% | VREF/16 |
| 5-level, 4x gain | −3/4, −3/8, 0, 3/8, 3/4 | 33% | 25% | VREF/25 |
| 9-level, 8x gain | −7/8, −21/32, −7/16, −7/32, 0, 7/32, 7/16, 21/32, 7/8 | 14% | 12.5% | VREF/64 |
| (G + 1)-level, Gx gain | ±(G − 1)/G, ±(G − 1)(G − 2)/$G^2$, ±(G − 1)(G − 4)/$G^2$, ±(G − 1)(G − 6)/$G^2$, ±(G − 1)(G − 8)/$G^2$ . . . | 1/(G − 1) | 1/G | VREF/$G^2$ |

Figure 12:
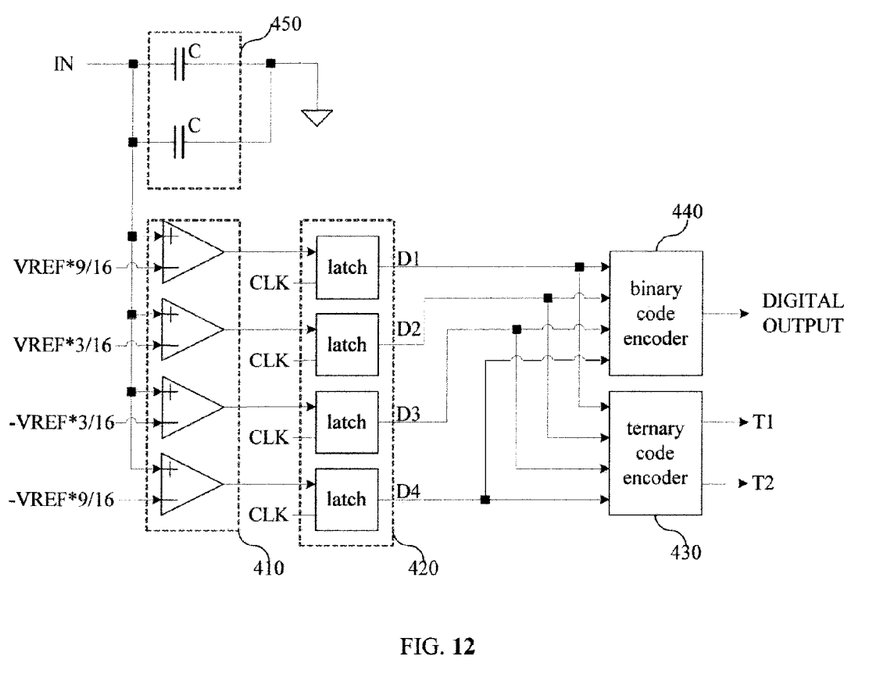
FIG. 12 depicts an exemplary embodiment of a minimum overhead 5-level pipeline stage for inter-stage gain of 4 in the sampling phase.

The minimum overhead pipeline stage in accordance with the present invention is preferably implemented by a switch-capacitor circuit, which operates with a two-phase clock. An exemplary embodiment for pipeline stage 200B_k during the "sampling" phase is shown in FIG. 12. Here, the input is sampled by an array of two parallel capacitors 450; each has capacitance of C. At the same time, the input is compared with four reference values: $9/16 \cdot VREF$, $3/16 \cdot VREF$, $-3/16 \cdot VREF$, and $-9/16 \cdot VREF$ using an array of four comparators 410. The four comparator outputs are latched by an array of four latches 420, resulting in four outputs: D1, D2, D3, and D4. The four outputs, which form a thermometer code representation of the 5-level ADC output, are converted into binary code representation by an encoder 440, which generates the digital output of this stage. At the same time, the four outputs are encoded into two ternary codes T1 and T2, each of which has three levels: −1, 0, and 1. An exemplary embodiment of the encoding scheme for T1 and T2 is shown in Table 2. The ternary codes T1 and T2 will be used to control DAC during the "hold" phase.

TABLE 2

| D1 | −1 | −1 | −1 | −1 | 1 |
|---|---|---|---|---|---|
| D2 | −1 | −1 | −1 | 1 | 1 |
| D3 | −1 | −1 | 1 | 1 | 1 |
| D4 | −1 | 1 | 1 | 1 | 1 |
| T1 | −1 | 0 | 0 | 1 | 1 |
| T2 | −1 | −1 | 0 | 0 | 1 |

Figure 13:
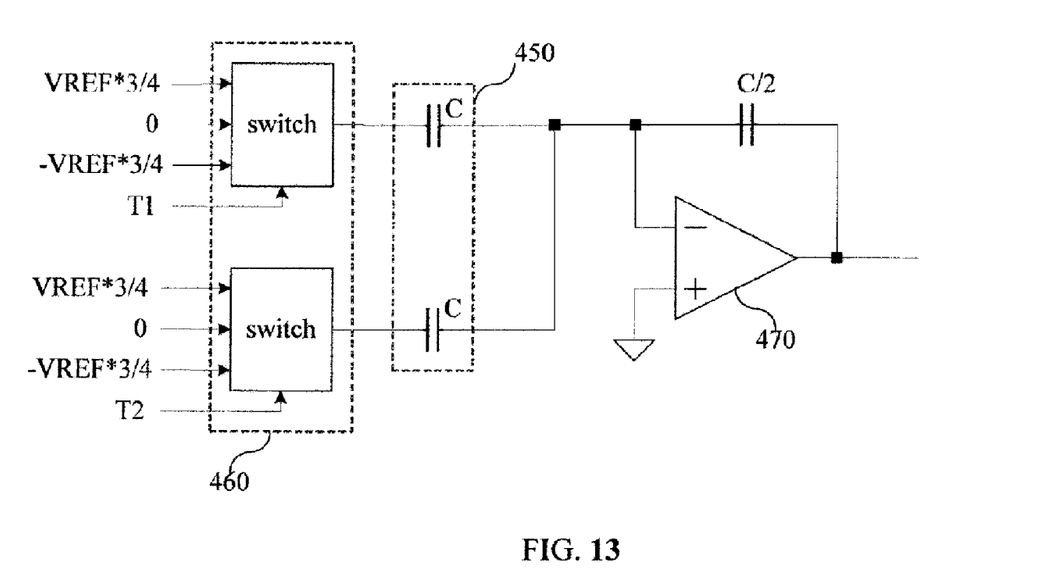
FIG. 13 depicts an exemplary embodiment of a minimum overhead 5-level pipeline stage for inter-stage gain of 4 in the hold phase.

An exemplary embodiment for pipeline stage 200B_k during the "hold" phase is shown in FIG. 13. There is an array of two switches 460. Each switch selects from three reference voltages: ¾·VREF, 0, and −¾·VREF. The two switches are controlled by the ternary code T1 and T2, respectively. When the ternary code is 1, it selects ¾·VREF. When the ternary code is −1, it selects −¾·VREF. Otherwise, it selects 0. In this manner, the 5-level DAC function is realized. The outputs from the two switches are connected to the array of two parallel capacitors 450. On the other side, the array of two parallel capacitors 450 is connected to the inverting terminal of an operational amplifier 470. The non-inverting terminal of the operational amplifier 470 is grounded. There is a capacitor with capacitance C/2 connected between the inverting terminal and the output of the operational amplifier 470. This arrangement realizes the inter-stage gain of four. For those of ordinary skill in the, the switch-capacitor circuit can be implemented using full differential circuit configuration.

In accordance with the present invention, it is also clear that 1.5-bit (3-level) architecture is indeed the optimum architecture for inter-stage gain of two.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pipeline analog-to-digital converter, comprising:
  a first pipeline stage, comprising:
    an analog-to-digital converter for generating a first digital output data by comparing an input voltage with N reference voltages, wherein N is an integer;
    a digital-to-analog converter for generating an output voltage according to the first digital output data;
    a calculating unit for calculating a quantization error of the input voltage and the output voltage; and
    an amplifier for amplifying the quantization error G times and generating a residual voltage, wherein G is greater than 2;
  and
    a second pipeline stage coupled to the first pipeline stage for generating a second digital output data according to the residual voltage;
  wherein N is greater than G−1 and smaller than 2*(G−1).

2. The pipeline analog-to-digital converter of claim 1, wherein the G is a value with power of two.

3. The pipeline analog-to-digital converter of claim 1, wherein first pipeline stage further comprises:
  a switch-capacitor circuit for sampling the input voltage according to an two-phase clock;
  wherein the operation of first pipeline stage is divided into sampling phase and holding phase that is determined by the two-phase clock.

4. The pipeline analog-to-digital converter of claim 1, wherein first pipeline stage further comprises:
  N comparators respectively receiving the N reference voltages and comparing the input voltage with N reference voltages to generate a thermometer code.

5. The pipeline analog-to-digital converter of claim 4, wherein first pipeline stage further comprises:
  a ternary code encoder for generating a ternary code according to the thermometer code;
  wherein the ternary code is used to control the digital-to-analog converter.

6. The pipeline analog-to-digital converter of claim 1, wherein first pipeline stage is a 1.5-bit pipeline stage.

7. The pipeline analog-to-digital converter of claim 1, comprises:
  an output encoder for encoding the first and the second digital output data and generating an output data;
  wherein the output data is corresponding to the input voltage.

8. A method of analog to digital converting, comprising:
  receiving an input voltage;
  generating a first digital data by comparing the input voltage with N reference voltages and generating, wherein the N is an integer;
  generating an output voltage according to the first digital output data;
  calculating a quantization error of the input voltage and the output voltage;
  amplifying the quantization error G times and generating a residual voltage, wherein G is greater than 2; and
  generating a second digital output data according to the residual voltage;
  wherein N is greater than G−1 and smaller than 2*(G−1).

9. The method of claim 8, wherein the G is a value with power of two.

10. The method of claim 8, further comprises:
  sampling the input voltage according to an two-phase clock;
  wherein the analog to digital converting method is divided into sampling phase and holding phase that is determined by the two-phase clock.

11. The method of claim 8, further comprises:
  generating a thermometer code according to comparing the input voltage the N reference voltages; and
  generating a ternary code according to the thermometer code.

12. A pipeline analog-to-digital converter, comprising:
  a first pipeline stage, comprising:
    an analog-to-digital converter for generating a first digital output data by comparing an input voltage with N reference voltages, wherein N is an integer;
    a digital-to-analog converter for generating an output voltage according to the first digital output data;
    a calculating unit for calculating a quantization error of the input voltage and the output voltage; and
    an amplifier for amplifying the quantization error N times and generating a residual voltage, wherein N is greater than 2;
  and
    a second pipeline stage coupled to the first pipeline stage for generating a second digital output data according to the residual voltage.

13. The pipeline analog-to-digital converter of claim 12, wherein the G is a value with power of two.

14. The pipeline analog-to-digital converter of claim 12, wherein first pipeline stage further comprises:
- a switch-capacitor circuit for sampling the input voltage according to an two-phase clock;
- wherein the operation of first pipeline stage is divided into sampling phase and holding phase that is determined by the two-phase clock.

15. The pipeline analog-to-digital converter of claim 12, wherein first pipeline stage further comprises:
- N comparators respectively receiving the N reference voltages and comparing the input voltage with N reference voltages to generate a thermometer code.

16. The pipeline analog-to-digital converter of claim 15, wherein first pipeline stage further comprises:
- a ternary code encoder for generating a ternary code according to the thermometer code;
- wherein the ternary code is used to control the digital-to-analog converter.

17. The pipeline analog-to-digital converter of claim 12 wherein first pipeline stage is a 1.5-bit pipeline stage.

18. The pipeline analog-to-digital converter of claim 12, comprises:
- an output encoder for encoding the first and the second digital output data and generating an output data;
- wherein the output data is corresponding to the input voltage.

* * * * *